United States Patent
Kindem et al.

(10) Patent No.: US 7,605,397 B2
(45) Date of Patent: Oct. 20, 2009

(54) CAPACITIVE BYPASS

(75) Inventors: Joel Kindem, San Diego, CA (US); Lars S. Carlson, Carlsbad, CA (US)

(73) Assignee: Digirad Corporation, San Diego, CA (US)

( * ) Notice: Subject to any disclaimer, the term of this patent is extended or adjusted under 35 U.S.C. 154(b) by 455 days.

(21) Appl. No.: 11/504,542

(22) Filed: Aug. 14, 2006

(65) Prior Publication Data
US 2007/0111343 A1 May 17, 2007

Related U.S. Application Data

(60) Provisional application No. 60/709,157, filed on Aug. 17, 2005.

(51) Int. Cl.
*H01L 29/40* (2006.01)
*H01L 29/88* (2006.01)

(52) U.S. Cl. .................. 257/46; 257/106; 257/E31.063

(58) Field of Classification Search .................. 257/46, 257/104, 106, 601, 656, 749, E31.063
See application file for complete search history.

(56) References Cited

U.S. PATENT DOCUMENTS

| | | | |
|---|---|---|---|
| 6,025,585 A | 2/2000 | Holland | |
| 6,504,178 B2 | 1/2003 | Carlson et al. | |
| 6,670,256 B2 | 12/2003 | Yang et al. | |
| 6,670,258 B2 | 12/2003 | Carlson et al. | |
| 6,677,182 B2 | 1/2004 | Carlson | |
| 6,736,416 B1 | 5/2004 | Romeo | |
| 7,256,470 B2 * | 8/2007 | Bui et al. ..................... 257/461 | |

* cited by examiner

*Primary Examiner*—Hoai V Pham
(74) *Attorney, Agent, or Firm*—Law Ofc SC Harris

(57) ABSTRACT

An indirect connection to and across a photodiode array. The backside contact is used as one portion which connects to a capacitor. The capacitor forms a shunt across the bulk substrate, thus shunting across the series resistance of the substrate, and reducing the series resistance.

13 Claims, 1 Drawing Sheet

CAPACITIVE BYPASS

CROSS-REFERENCE TO RELATED APPLICATIONS

This application claims priority to U.S. Application Ser. No. 60/709,157, filed on Aug. 17, 2005. The disclosure of the prior application is considered part of (and is incorporated by reference in) the disclosure of this application.

BACKGROUND

Certain kinds of electromagnetic radiation detectors, for example semiconductor photodiodes, are known which have connections on both sides of the substrate, and have resistive or capacitive structures in between those connections. The high series resistance between contacts on the side of the substrate may adversely affect the noise performance of these devices. Any antireflective coating may add to this series resistance.

Back illuminated photodiode structures are described in U.S. Pat. No. 6,025,585. U.S. Pat. Nos. 6,670,258 and 6,736,416 show backside illuminated photodiodes that include backside bias electrode layers.

In such backside illuminated photodiodes, the light enters the device through the rear, so that the bias electrode layer and/or the back contact layer must be optically transparent to act as an optical window. The term back contact window is a generic term for a doped backside layer that acts as an optical window.

U.S. Pat. No. 6,504,178 describes an indirect back surface contact the provides an electrical connection to the flat side window of a backside illuminated photodiode. The indirect back surface contact is through undepleted substrate materials outside the depletion region's of the individual photodiodes. The connection may also be made through guard structures of those photodiodes. This type of contact permits the use of insulating antireflective coating structures to improve quantum efficiency.

A back contact indirect structure may improve the quantum efficiency as noted above, and may also simplify attachment of the device to a printed circuit board, since all electrical contacts are made on one side of the substrate.

DETAILED DESCRIPTION

The general structure and techniques, and more specific embodiments which can be used to effect different ways of carrying out the more general goals, are described herein.

A backside illuminated semiconductor photodiode has a semiconductor substrate with electrical contacts at both ends. The photodiode receives light at its "backside". The substrate is usually biased into a depleted or fully depleted mode.

A photodiode array may include a semiconductor substrate of a first conductivity type, having a front side with doped regions of a second conductivity type, and an opposing backside with a heavily doped bias electrode layer of the first conductivity type. The semiconductor substrate can be crystalline and may be lightly doped for n type conductivity ("n−") and high resistivity. A heavily doped back contact layer can be within the crystalline substrate or external to the crystalline substrate.

Figure 1:
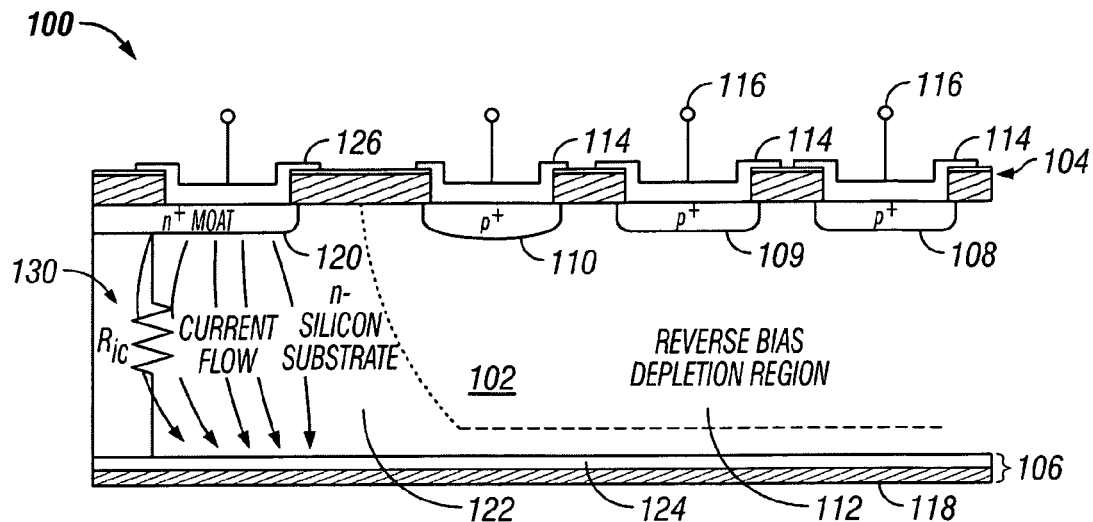
FIG. 1 shows a diagram of a photodiode array with indirect back contact.

FIG. 1 shows an exemplary portion of such a photodiode array, showing the substrate 122 being an n− silicon substrate. The doped regions are referred to as gates, which is generic to their function as either anodes or cathodes. Gates 108, 109, 110 are of a p-type, and a bias electrode layer 124, also of the p-type. A backside contact layer 118 forms a connection to the backside bias electrode layer.

The back contact layer 118 and bias electrode layer 124 collectively form the back connection window. Metal or polysilicon contacts 114 may be formed directly on the gates to provide ohmic contacts.

A potential difference is applied between the p type gates 108 and the n− the type substrate 102. This produces depletion regions 112 that are essentially devoid of majority carriers. In an n− type substrate, the majority carriers are electrons. Under a proper bias (here reverse bias) and proper magnitude, the depletion regions 112 may extend deeply into or completely through the thickness of the substrate.

The elements of this window, for example the bias electrode layer, need to be thin enough to be transparent to incident radiation. Still, this layer must be sufficiently conductive to provide an adequate potential surface on the back surface of the substrate that is adequate to maintain a uniform depletion region under the entire surface beneath each gate.

The quantum efficiency may also be enhanced by using an antireflective coating over the backside connection window. Different kinds of transparent dielectric conductive anti-reflection coatings have been used, including Indium tin oxide.

A photodiode is formed by the gate, the substrate, and the backside contact window. Back illuminated photodiodes typically use high resistivity substrate materials that have resistivities in the range between one k ohm cm and 20 k ohm-centimeter. Silicon devices typically have an n type substrate as the first conductivity type and p-type gates as the second conductivity type as shown in FIG. 1. Other devices and other materials may also be used. The opposite sense materials, in which the substrate is p-type and the gates are n type is also contemplated by this application. Moreover, this application may also be used in other photodetectors, especially those that require the use of a backside contact window.

Photodiodes are often used in imaging applications such a single photon emission tomography called SPECT. Very low noise is typically required for optimum image quality. Typically, the series resistance $R_{ic}$ of the undepleted bulk substrate between the front and rear contacts forms the dominant component of the overall device resistance. The series resistance may form a noise source that limits the attainable image quality level from the diode.

Thermal noise forms another source of noise in these devices, caused by the random motion of the charge carriers along with the series resistance.

$$Vn^2 = 4KTBR_{ic}$$

Where K is Boltzmann constant $1.3806503 \times 10^{-23}$ m$^2$kg s$^{-2}$K$^{-1}$ T is temperature in Kelvin, B is the bandwidth (hz) and $R_{ic}$ is the real part of the impedance between the front contact and back contact window, in ohms.

$R_{ic}$ is in series with the capacitance of each pixel of the photodiode array. Therefore, the thermal noise from $R_{ic}$ induces a noise current in addition to the signal current collected in response to photons impinging on the backside of the photodiode pixel, according to the relationship:

$$In = Vn/R_{ic}$$

The combination of backside contact window, antireflective coating, and other structures can be referred to herein generically as "backside insulators", and it should be noted that other structures may also form a portion of the insulation.

In an embodiment, resistive noise injection is reduced by using conductive layers over at least a portion of the backside insulators to form an external electrode, and to connect those external electrodes to at least one capacitor. The capacitors connected in this way provide a low impedance path between the two terminals of the series resistance, thereby bypassing any noise associated with the resistance.

According to another aspect, backside insulators that are already part of the device structure form the dielectric for the bypass capacitor. This may form a capacitor without depositing all the additional capacitive layers and thereby reduce the complexity of the process to add the bypass capacitor. Moreover, since these layers are already present, this will not cause any further degradation of the device or its performance.

In one embodiment, the external electrode material 145 may be patterned to prevent occlusion of the window.

FIG. 1 shows an embodiment where a contact is made to the backside 106 of the diode through from the front side 104. The connection includes forming a moat 120 that is accessible from the front side 104 of the device. The moat may be heavily doped but of the same conductivity type as the substrate, so here n+. Note that the backside contact window 106 is similarly doped to n+.

In this embodiment, backside contact window may be a bias electrode layer formed of a monocrystalline layer that is native to the substrate as described in the U.S. Pat. No. 6,670,258, or may be a back contact layer external to the substrate. The back contact layer might typically not be monocrystalline, but may be native to the substrate such as a polysilicon on crystalline silicon.

The back contact window layer on the moat are both highly doped n type, and on the front side of the moat, a guard ring 110 may be provided to isolate the moat 120 from the other pixels in the array.

The back contact window provides an equipotential region extending across the entire backside of the substrate, as described above. This makes contact with the backside of the depletion region of the guard ring 110 and of the individual pixels.

The material that is outside the depletion region of the substrate 102 is effectively undepleted substrate material 122. This forms an equivalent resistance, shown in FIG. 1 as resistor 130. While the resistance $R_{ic}$ is typically dominated by the resistance of the undepleted bulk material, it may also include contact resistance between an internal ohmic contact 126 and the moat 120 as well as the series resistance of the material of the moat. In addition, this may include other spatially distributed resistive elements.

Accordingly, the moat 120 makes contact with the backside window through that undepleted substrate material across the resistor $R_{ic}$. An objective is to minimize the introduction of noise generated by the series resistance $R_{ic}$ into the signal currents of the individual photodiodes in the array 100.

An external antireflective coating 118 is formed on the backside of substrate 102 in order to maximize the external quantum efficiency of the photodiode array. This may form the one or more separate layers of different dielectrics.

Figure 2:
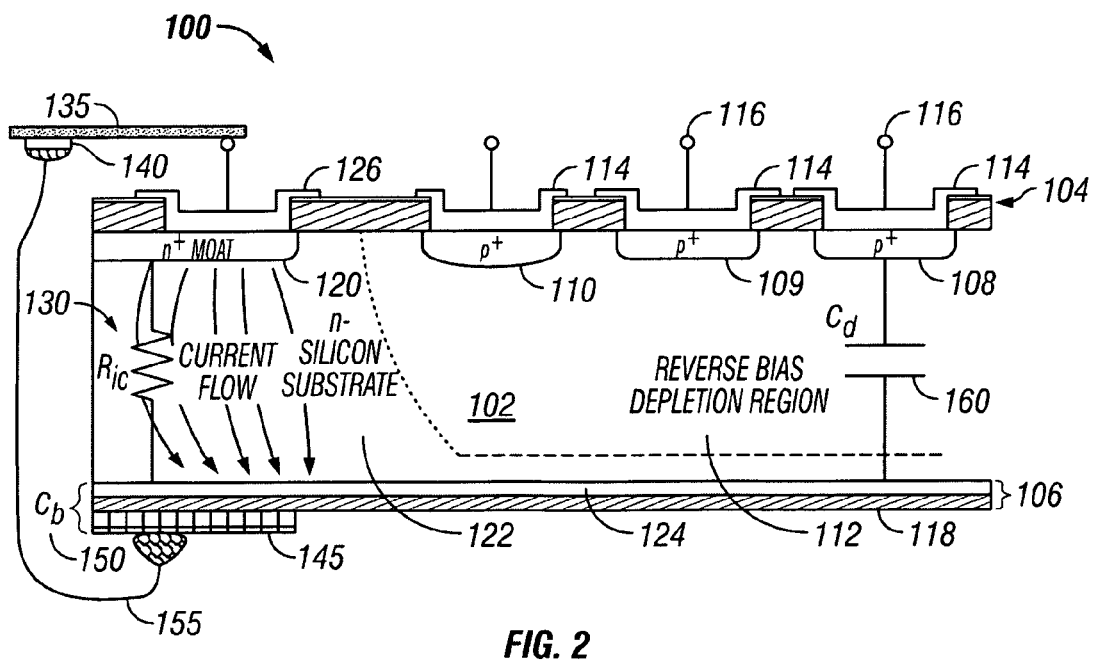
FIG. 2 shows a diagram of a photodiode array with capacitively bypassed indirect back contact.

Another embodiment shown in FIG. 2 uses additional contact structures. A conductive strip 130 is formed which connects to the contact electrode 126 that connects to the moat 120. The conductive strip 135 may be attached via wire bonding or solder bump interconnection. While the strip is shown in the drawing as floating in space, a number of different connector types could be used including a wire in a ribbon cable, all or a portion of the trace on a circuit board, a lead in a flexible connector, or the like. Contact pad 145 is formed on the strip 135 to facilitate attachment of wires.

Analogously, a conductive external electrode 145 is formed over a portion of the antireflective coating 118. The collective backside insulators, along with the external electrode contact 145, collectively forms a bypass capacitor shown as $C_b$ 150 in FIG. 2.

A conductive wire 155 may be connected between the moat 120 and the external electrode 145. The connections may be by wire bond, soldering, ultrasonic wire bonding, thermal compression wire bonding, tack welding, conductive ink or epoxy deposition. Conductive adhesive bonding could be employed to attach to either end of the wire 155. The circuit forms a parallel RC circuit including the resistive part $R_{ic}$ and the capacitor $C_b$. Thermal noise generated between the terminals of this parallel circuit are given by $$\langle v_n^2 \rangle = \frac{4kTR_{ic}}{2\pi R_{ic} C_b} = \frac{2kT}{\pi C_b},$$

where k is the Boltzmann constant and T is the absolute temperature in kelvin.

It may be desirable to maximize the area of the external electrode contact 145 in order to maximize the capacitance of $C_b$. Because antireflective coatings are often very thin, for example less than 120 nm, capacitances of thousands of picofarads can be formed in some cases. For example, a photodiode array chip that has sides are roughly 10.6 mm long, a moat 120 540 um wide along the entire perimeter of the chip, and an antireflective coating 100 nm thick with a relative dielectric constants of 3, may form a capacitance $C_b$ of approximately 6000 picofarads, if the external electrode contact 145 has the same area as the moat. For a series resistance of 2000 ohms, the thermal noise due to $R_{ic}$ will be reduced by a factor F, where $$F = \frac{C_d}{C_b + C_d}$$

and $C_d$ 160 is the detector capacitance between p+ gate region 108 and the back contact window 124 of a pixel of the device in the FIG. 2 embodiment.

FIG. 2 simplifies the circuit by showing the detector capacitance for only one pixel of the photodiode array. However, in reality, each pixel will have an analogous capacitance, so the total capacitances would be an additive combination of all the capacitances 160.

Thus, for an $R_{ic}$ of 2000 ohms, $C_d$ of 6 pf, and $C_b$ of 5800 pf, the thermal noise associated with $R_{ic}$ will be reduced by a factor of approximately a thousand. This in turn reduces the series noise term by the square root of a thousand or approximately 30. This factor excludes the sheet resistivity of the external electrode contact 145 and the back contact window of the detector pixel. The total resistance of those may dominate the series noise. The typical back contact window sheet resistances are in the range of 102-600 ohms, thus significantly increasing their level.

The general structure and techniques, and more specific embodiments which can be used to effect different ways of carrying out the more general goals are described herein.

Although only a few embodiments have been disclosed in detail above, other embodiments are possible and the inventor(s) intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other devices and conductivity types may be used.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be a Pentium class computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

What is claimed is:

1. A photodiode array, comprising:
a semiconductor substrate including first surface, including a plurality of gates thereon, a second opposing surface, forming an optical window to receive illumination therethrough, and a capacitively coupled contact, coupled between said second surface and said first surface.

2. An array as in claim 1, further comprising a moat connection accessible from said first surface, having a same conductivity type as the substrate, allowing connecting to said rear surface.

3. An array as in claim 1, wherein said gates are of an opposite conductivity type as said substrate, and form a depletion region there around, and wherein said moat connection is outside said depletion region.

4. An array as in claim 3, further comprising of guard ring, guarding between said depletion region and an area of said moat.

5. An array as in claim 1, further comprising a structure connecting to an undepleted bulk portion of the substrate, in series with said capacitance.

6. An array as in claim 1, wherein said semiconductor substrate is of an n− type, and said gates are all p+ type.

7. An array as in claim 1, further comprising a backside contact window, on said second opposing surface.

8. An array as in claim 7, wherein said backside contact window includes at least a transparent electrode.

9. An array as in claim 8, further comprising an anti-reflection part, over said backside contact window.

10. An array as in claim 8, wherein said capacitively coupled contact uses said transparent electrode as one element of said capacitively coupled contact.

11. An array as in claim 2, wherein said capacitively coupled contact includes a capacitor structure formed on said second surface, and a wire extending between said capacitor structure and said moat connection.

12. A backside illuminated photodiode, comprising:
a semiconductor substrate having a first surface, with a plurality of photodiode elements, said first surface including a plurality of gates forming photodiodes with the substrate, and adapted to form a depletion region in the substrate therearound, a guard area, which forms a guard around said depletion region, and a moat area which allows a connection to an undepleted portion of the semiconductor substrate; and
a second surface, having a illumination window, a bias connection, allowing bias connection for the photodiodes, and a capacitive connection, between said bias connection, and said moat.

13. A diode as in claim 12, wherein said moat and said substrate are the same conductivity type, and said gates are opposite conductivity types.

* * * * *